(12) United States Patent
Reddy

(10) Patent No.: US 9,831,875 B2
(45) Date of Patent: Nov. 28, 2017

(54) CIRCUIT TECHNIQUE TO ENHANCE SLEW RATE FOR HIGH SPEED APPLICATIONS

(71) Applicant: Synopsys, Inc., Mountain View, CA (US)

(72) Inventor: Basannagouda Somanath Reddy, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/577,948

(22) Filed: Dec. 19, 2014

(65) Prior Publication Data
US 2016/0182050 A1    Jun. 23, 2016

(51) Int. Cl.
*H03K 19/018*    (2006.01)
*H03K 19/0185*   (2006.01)

(52) U.S. Cl.
CPC .............. *H03K 19/018507* (2013.01)

(58) Field of Classification Search
CPC ..... H03K 19/00361; H03K 19/018521; H03K 17/162; H03K 17/166; H04L 25/061; H04L 25/0272; H04L 25/0276; H04L 25/0278

USPC .......... 327/108, 109, 110, 111, 112
See application file for complete search history.

(56) References Cited

U.S. PATENT DOCUMENTS

| | | | | |
|---|---|---|---|---|
| 6,313,672 B1* | 11/2001 | Ajit | .................. | H03K 19/00315 326/27 |
| 6,836,144 B1* | 12/2004 | Bui | ..................... | H04L 25/0278 326/26 |
| 2002/0135405 A1* | 9/2002 | Chen | ................ | H03K 19/00361 327/112 |
| 2002/0190774 A1* | 12/2002 | Manganaro | .......... | G11C 27/026 327/291 |

\* cited by examiner

*Primary Examiner* — John Poos
(74) *Attorney, Agent, or Firm* — Alston & Bird LLP

(57) ABSTRACT

A circuit is disclosed. The circuit includes an output driver with a pull-up device, and a pull-down device. The circuit also includes a pre-driver, configured to generate a first signal for the pull-up device and to generate a second signal for the pull-down device, a first positive feedback circuit configured to increase the slew rate of the first signal in response to a transition in the second signal, and a second positive feedback circuit configured to increase the slew rate of the second signal in response to a transition in the first signal.

14 Claims, 4 Drawing Sheets

CIRCUIT TECHNIQUE TO ENHANCE SLEW RATE FOR HIGH SPEED APPLICATIONS

TECHNICAL FIELD

This disclosure generally relates to integrated circuit applications, and more particularly to digital output buffers of integrated circuits.

BACKGROUND

A high-speed IC chip device may comprise a plurality of output buffers. Each output buffer may be used to translate voltage signals from a first voltage domain to a second voltage domain. The first voltage domain may, for example, be associated with a core voltage of the IC chip device. The second voltage domain may be associated with an input/output (I/O) voltage of the IC chip device. The output buffers may also be used to provide adequate drive strength for transmitting voltage signals over high capacitive output loads with minimal loss in signal integrity.

SUMMARY

One inventive aspect is a circuit. The circuit includes an output driver with a pull-up device, and a pull-down device. The circuit also includes a pre-driver, configured to generate a first signal for the pull-up device and to generate a second signal for the pull-down device, a first positive feedback circuit configured to increase the slew rate of the first signal in response to a transition in the second signal, and a second positive feedback circuit configured to increase the slew rate of the second signal in response to a transition in the first signal.

Another inventive aspect is a method of manufacturing a circuit. The method includes forming an output driver by forming a pull-up device and a pull-down device, and forming a pre-driver, configured to generate a first signal for the pull-up device and to generate a second signal for the pull-down device. The method also includes forming a first positive feedback circuit configured to increase the slew rate of the first signal in response to a transition in the second signal, and forming a second positive feedback circuit configured to increase the slew rate of the second signal in response to a transition in the first signal.

DESCRIPTION OF EXAMPLE EMBODIMENTS

Figure 1:
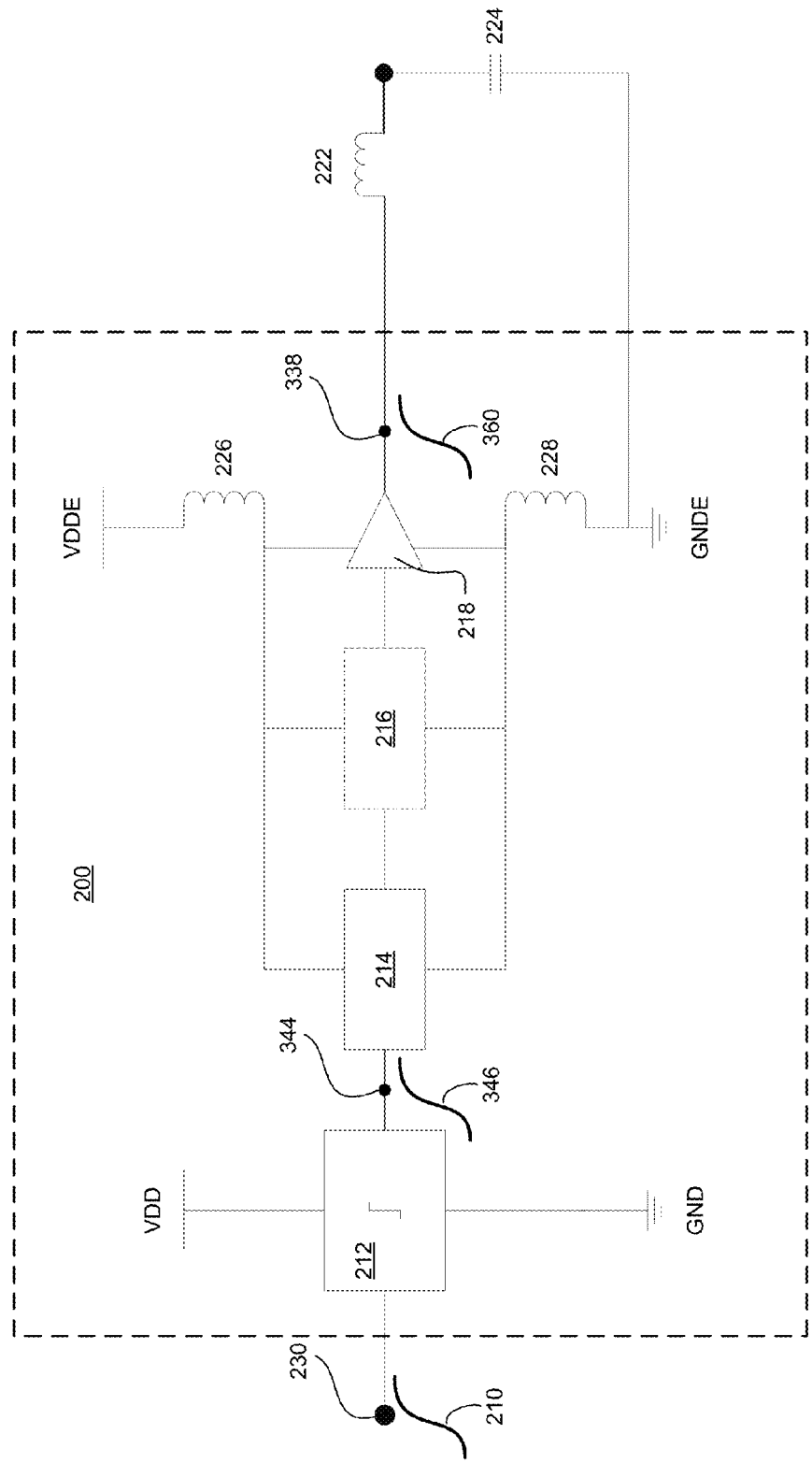
FIG. 1 illustrates an example output buffer.

FIG. 1 illustrates an example output buffer 200. A prior art embodiment of the output buffer 200 may comprise five modules—a level shifter (LS) 212, a pre-driver 214, an output driver 218, an inductor 226, and an inductor 228. LS 212 may be used to transform a voltage signal from one voltage domain to another. As an example and not by way of limitation, LS 212 may transform a voltage signal 210 that it receives from a core of an IC chip device of the output buffer 200, from a core voltage domain that comprises a VDD and a GND, to an I/O voltage domain that comprises a VDDE and a GNDE. The transformation of the voltage signal 210 helps the pre-driver 214, output driver 218, and any associated circuits that use the I/O voltage domain to properly interpret a logic high and a logic low of the voltage signal 210. In particular embodiments, an output buffer 200 may further comprise a slew rate enhancement circuit 216 that is electrically coupled between the pre-driver 214 and the output driver 218.

In particular embodiments, an output 338 of output driver 218 of the output driver 200 may be mechanically coupled to a bond pad of an IC chip device. The bond pad and its associated bond wire may serve to connect, electrically and mechanically, the output buffer 200 to a package substrate of the IC chip device. In particular embodiments, the bond pad and its associated bond wire may be electrically represented by an inductor 222 whose value L3 is determined based at least in part on an equivalent combined inductance of the bond pad and its associated bond wire. In particular embodiments, a capacitor 224, representing a capacitive load, may be electrically coupled between the inductor 222 and GNDE. As an example and not by way of limitation, the value of capacitor 224 (CL) may be derived based at least in part on combined capacitances of the bond pad, the associated bond wire of the bond pad, and any downstream electrical or mechanical components connected to output 338. Although this disclosure describes and illustrates an output driver 200 coupled to a package substrate of an IC chip device in a particular way with particular components, this disclosure contemplates any suitable ways and any suitable components for coupling the output driver 200 to the package substrate of the IC chip device.

In particular embodiments, an inductor 226 may be electrically coupled between VDDE and each of pre-driver 214, slew rate enhancement circuit 216, and output driver 218. Value L1 of the inductor 226 reflects an equivalent total inductance of electrical and/or mechanical connections between VDDE and each of pre-driver 214, slew rate enhancement circuit 216, and output driver 218. In particular embodiments, an inductor 228 may be electrically coupled between GNDE and each of pre-driver 214, slew rate enhancement circuit 216, and output driver 218. Value L2 of the inductor 228 may reflect an equivalent total inductance of any electrical and/or mechanical connections between GNDE and each of the pre-driver 214, slew rate enhancement circuit 216, and output driver 218. In particular embodiments, L1, L2, L3, and CL may each be determined based at least in part by one or more design, manufacturing, functional, and operational aspects of the IC chip device. Design aspects of the IC chip device may comprise a packaging design and a layout. Operational aspects of the IC chip device may comprise an operating temperature and an operating frequency. As an example and not by way of limitation, output buffer 200 may possess the following electrical characteristics: L1 of 5 nH, L2 of 5 nH, L3 of 5 nH, and CL of 20 pF at an operating frequency of 50 Mhz. As yet another example and not by way of limitation, inductor 226 may have a value of SSO*Lup and inductor 228 may have a value of SSO*Ldown, where SSO is a number of output buffers 200 in the IC chip device that are switching at the same time. Furthermore, Lup and Ldown are respective values for an inductor 226 and an inductor 228 of a single output buffer 200.

In the embodiment of output buffer 200, pre-driver 214 drives output driver 218, which drives the capacitive and inductive loads discussed above at output 338. Pre-driver 214 and output driver 218 are sized based on power and slew rate constraints as well as constraints on the load presented to the driver of input 344.

Figure 2:
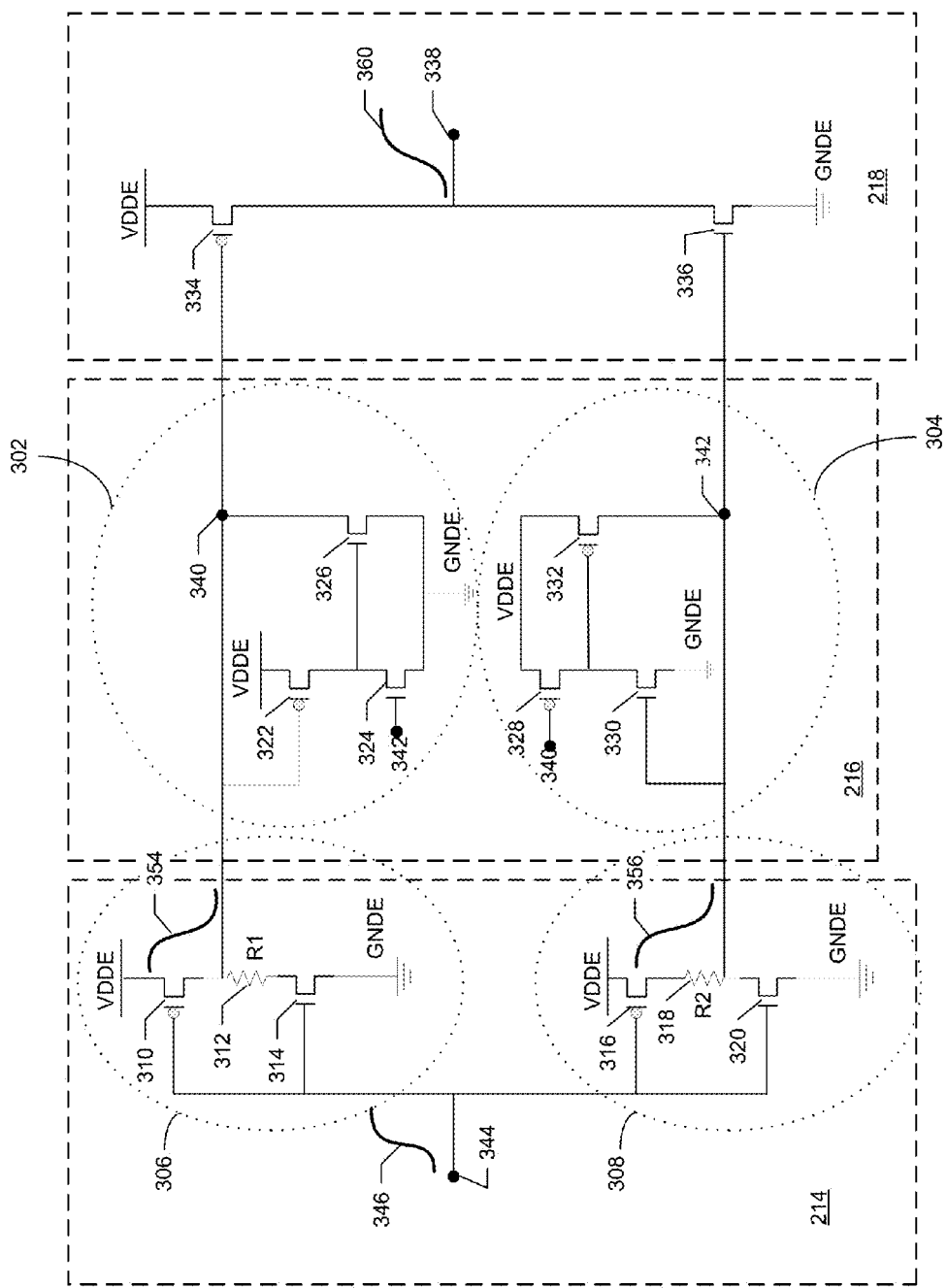
FIG. 2 illustrates an example slew rate enhancement circuit, electrically coupled to a pre-driver and an output driver of an output buffer.

FIG. 2 illustrates a schematic view of an example buffer 200. As shown, pre-driver 214 includes, as nonlimiting examples, inverters 306 and 308. Inverter 306 drives pull-up device 334 of output driver 218. In some embodiments, pre-drivers having different architectures are alternatively used. In addition, inverter 308 drives pull-down device 336 of output driver 218. As illustrated in FIG. 2, pull-up device 334 comprises, as an example, a single transistor. Other pull-up devices may alternatively be used. Similarly, as illustrated in FIG. 2, pull-down device 336 comprises, as an example, a single transistor. Other pull-down devices may alternatively be used.

In order to prevent pull-up device 334 and pull-down device 336 from being simultaneously turned on, inverters 306 and 308 of pre-driver 214 each include a resistor.

The output of inverter 306, which drives signal node 340 transitions from a low value (GNDE) to a high value (VDDE) using a conductive path, which includes transistor 310. Similarly, the output of inverter 306 transitions from the high value to the low value using a conductive path, which includes transistor 314. Because the conductive path which includes transistor 314 also includes resistor 312, slew rate for transitions from the high value to the low value are based partly on the value R1 of resistor 312. Transistors 310 and 314, and resistor 312 are sized so that the slew rate of transitions of signal node 340 from the low value to the high value is faster than the slew rate of the transitions of signal node 340 from the high value to the low value. As a result, as measured from transitions at input 344, pull-up device 334 turns off faster than pull-up device 334 turns on.

Similarly, the output of inverter 308, which drives signal node 342 transitions from a low value (GNDE) to a high value (VDDE) using a conductive path, which includes transistor 316 and resistor 318, and the output of inverter 308 transitions from the high value to the low value using a conductive path, which includes transistor 320. Because the conductive path which includes transistor 316 also includes resistor 318, slew rate for transitions from the low value to the high value are based partly on the value R2 of resistor 318. Transistors 316 and 320, and resistor 318 are sized so that the slew rate of transitions of signal node 342 from the high value to the low value is faster than the slew rate of the transitions of signal node 342 from the low value to the high value. As a result, as measured from transitions at input 344, pull-down device 336 turns off faster than pull-down device 336 turns on.

Transistors 310, 314, 316, and 320, and resistors 312 and 318 also sized so that for output transitions from low value to high value, pull-up device 334 turns on after pull-down device 336 turns off, and so that for output transitions from high value to low value, pull-up device 334 turns off before pull-down device 336 turns on.

FIG. 2 illustrates an example slew-rate-enhancement circuit 216, which provides improved slew rate performance. The slew rate of voltage signal 360 at output 338 is based at least in part on the slew rate of the voltage transitions at signal node 340 and the slew rate of voltage transitions at signal node 342.

As discussed above, the slew rate of voltage transitions from VDDE to GNDE at signal node 340 is based on the value R1 of resistor 312. Furthermore, the slew rate of voltage transitions from GNDE to VDDE at signal node 342 is based on the value R2 of resistor 318. The polarity-dependent decreased slew rates are beneficial, as discussed above, to ensure that devices 334 and 336 of output driver 218 do not simultaneously conduct current. However, for each transition, the usefulness of the decreased slew rate ceases once the device (334 or 336) which is turning off has stopped conducting. From that time forward, the decreased slew rate is unnecessary and undesirable. As discussed in more detail below, slew rate enhancement circuit 216 increases the slew rate at nodes 340 and 342 after the turning off devices have stopped conducting.

For example, for a positive transition at output 338 from GNDE to VDDE, slew rate enhancement circuit 216 increases the slew rate at node 340 after device 336 has been turned off. Likewise, for a negative transition at output 338 from VDDE to GNDE, slew rate enhancement circuit 216 increases the slew rate at node 342 after device 334 has been turned off. As a result, the slew rate enhancement circuit 216 increases the slew rate of voltage signal 360 at output 338 and reduces a propagation delay of the voltage signal 360, as further illustrated by FIGS. 3 and 4, discussed below.

As shown in FIG. 2, slew rate enhancement circuit 216 is electrically coupled to pre-driver 214 and to output driver 218 of an output buffer 200. In particular embodiments, input 344 of pre-driver 214 may be electrically coupled to an output of LS 212 of output buffer 200. Output 338 of output driver 218 may be electrically coupled to a bond pad of an IC chip device.

As shown in FIG. 2, slew rate enhancement circuit 216 includes two positive feedback circuits 302 and 304. Each positive feedback circuit includes a non-inverting amplifier having its output connected to its input. The specific circuit topologies illustrated in FIG. 2 are nonlimiting examples. Other circuit topologies and architectures may be used in alternative embodiments.

As shown in the example of FIG. 2, positive feedback circuit 302 is connected to node 340 and is configured to increase the slew rate of negative voltage transitions at node 340 after pull-down device 336 has turned off. Positive feedback circuit 302 includes two inverting stages. The first inverting stage includes transistor 322 and transistor 324, and the second inverting stage includes transistor 326.

The first inverting stage receives one input signal at each of transistors 322 and 324. Specifically, the gate of transistor 322 is connected to the first input, node 340, which is connected to the output of inverter 306 and to the input of pull-up device 334. In addition, the gate of transistor 324 is connected to the second input, node 342, which is connected to the output of inverter 308 and the input of pull-down device 336.

Signals at each of the first and second input nodes 340 and 342 are inverted by the first inverting stage to generate an output for the second inverting stage of positive feedback circuit 302. In the example of FIG. 2, transistor 326, of the second inverting stage, receives the output of the first inverting stage, and provides a conductive path between node 340 and GNDE having a conductance which is based on the output of the first inverting stage.

Positive feedback circuit 302 increases the negative transition slew rate at node 340 by conducting current through transistor 326 from node 340 to GNDE. This occurs in response to negative voltage transitions at nodes 340 and 342, which respectively cause transistor 322 to turn on and transistor 324 to turn off.

In addition, transistor 326 conducts current from node 340 to GNDE after pull-down device 336 has turned off. In the embodiment of FIG. 2, transistors 322 and 324 may be sized so that positive transitions at the gate of transistor 326 occur only after negative transitions at node 342 have turned off pull-down device 336. In some embodiments, transistors 324 and 336 are matched and sized so that transistor 336 turns off before (or at a higher gate voltage) transistor 324 turns off. Because positive transitions at the gate of transistor 326 are conditioned on pull-down device 336 having been turned off, the increase in negative voltage transition slew rate at node 340 occurs only after pull-down device 336 has been turned off.

Positive feedback circuit 304 operates similarly. As shown in the example of FIG. 2, positive feedback circuit 304 is connected to node 342 and is configured to increase the slew rate of positive voltage transitions at node 342 after pull-up device 334 has turned off. Positive feedback circuit 304 includes two inverting stages. The first inverting stage includes transistor 328 and transistor 330, and the second inverting stage includes transistor 332.

The first inverting stage receives one input signal at each of transistors 328 and 330. Specifically, the gate of transistor 328 is connected to the first input, node 340, which is connected to the output of inverter 306 and to the input of pull-up device 334. In addition, the gate of transistor 330 is connected to the second input, node 342, which is connected to the output of inverter 308 and the input of pull-down device 336.

Signals at each of the first and second input nodes 340 and 342 are inverted by the first inverting stage to generate an output for the second inverting stage of positive feedback circuit 304. In the example of FIG. 2, transistor 332, of the second inverting stage, receives the output of the first inverting stage, and provides a conductive path between node 342 and VDDE having a conductance which is based on the output of the first inverting stage.

Positive feedback circuit 304 increases the positive transition slew rate at node 342 by conducting current through transistor 332 from VDDE to node 342. This occurs in response to positive voltage transitions at nodes 342 and 340, which respectively cause transistor 340 to turn on and transistor 330 to turn off.

In addition, transistor 332 conducts current from VDDE to node 342 after pull-up device 334 has turned off. In the embodiment of FIG. 2, transistors 328 and 330 may be sized so that negative transitions at the gate of transistor 332 occur only after positive transitions at node 342 have turned off pull-up device 334. In some embodiments, transistors 328 and 334 are matched and sized so that transistor 334 turns off before (or at a lower gate voltage) transistor 328 turns off. Because negative transitions at the gate of transistor 332 are conditioned on pull-up device 332 having been turned off, the increase in positive voltage transition slew rate at node 342 occurs only after pull-up device 334 has been turned off.

Embodiments discussed herein are particularly well suited for implementation in fabrication processes which are low voltage and have small critical dimensions and feature sizes. For example, there are no current paths from power to ground which include more than two transistors. In addition, as discussed above, the sequential turning on of the positive feedback circuits after the turning off of the devices of the output driver may be guaranteed by sizing relationships between devices instead of absolute sizes; the embodiments are tolerant of imprecise device modeling.

For example, the devices discussed herein may be formed using processing steps known in the art, for example, to form transistors having a gate length of 28 nm, 20 nm, or less than 20 nm, such as 16 nm. In some embodiments, the devices may be formed in a 1.8 v manufacturing process.

The embodiments discussed herein may be implemented, for example, using MOSFET devices, Tri-Gate FET devices, FinFET devices, SOI MOSFET devices, and other switching devices.

In particular embodiments, each pull-up device as illustrated in FIG. 2 may be a P-channel metal-oxide semiconductor (PMOS) transistor, or any suitable conductive device that may conduct an electrical current between a first and a second terminal based at least in part on a low voltage at a third terminal. In particular embodiments, each pull-down device as illustrated in FIG. 2 may be an N-channel metal-oxide semiconductor (NMOS) transistor, or any suitable conductive device that may conduct an electrical current between a first and a second terminal based at least in part on a high voltage amplitude at a third terminal.

Although this disclosure describes a slew rate enhancement circuit 216 electrically coupled to a pre-driver 214 and an output driver 218 of an output buffer 200 of FIG. 2 in a particular manner, this disclosure contemplates the slew rate enhancement circuit 216 electrically coupled to any pre-driver and any output driver of any output buffer in any suitable manner. Particular embodiments may repeat one or more elements of FIG. 2, where appropriate. Although this disclosure describes and illustrates particular elements of a slew rate enhancement circuit 216, a pre-driver 214 and an output driver 218 of FIG. 2 as placed in a particular order, this disclosure contemplates any suitable elements of FIG. 2 as placed in any suitable order. Furthermore, although this disclosure describes and illustrates particular components, devices, or systems carrying out particular steps of electrically coupling a slew rate enhancement circuit 216 with a pre-driver 214 and an output driver 218 of FIG. 2, this disclosure contemplates any suitable combination of any suitable components, devices, or systems carrying out any suitable steps of electrically coupling the slew rate enhancement circuit 216 with any pre-driver and any output driver in any suitable manner. In addition, although this disclosure describes and illustrates voltage signals at one or more signal nodes of an output buffer 200 as occurring in a particular sequence and manner, this disclosure contemplates any voltage signals at any signal nodes of the output buffer 200 occurring in any suitable sequence and manner.

Figure 3:
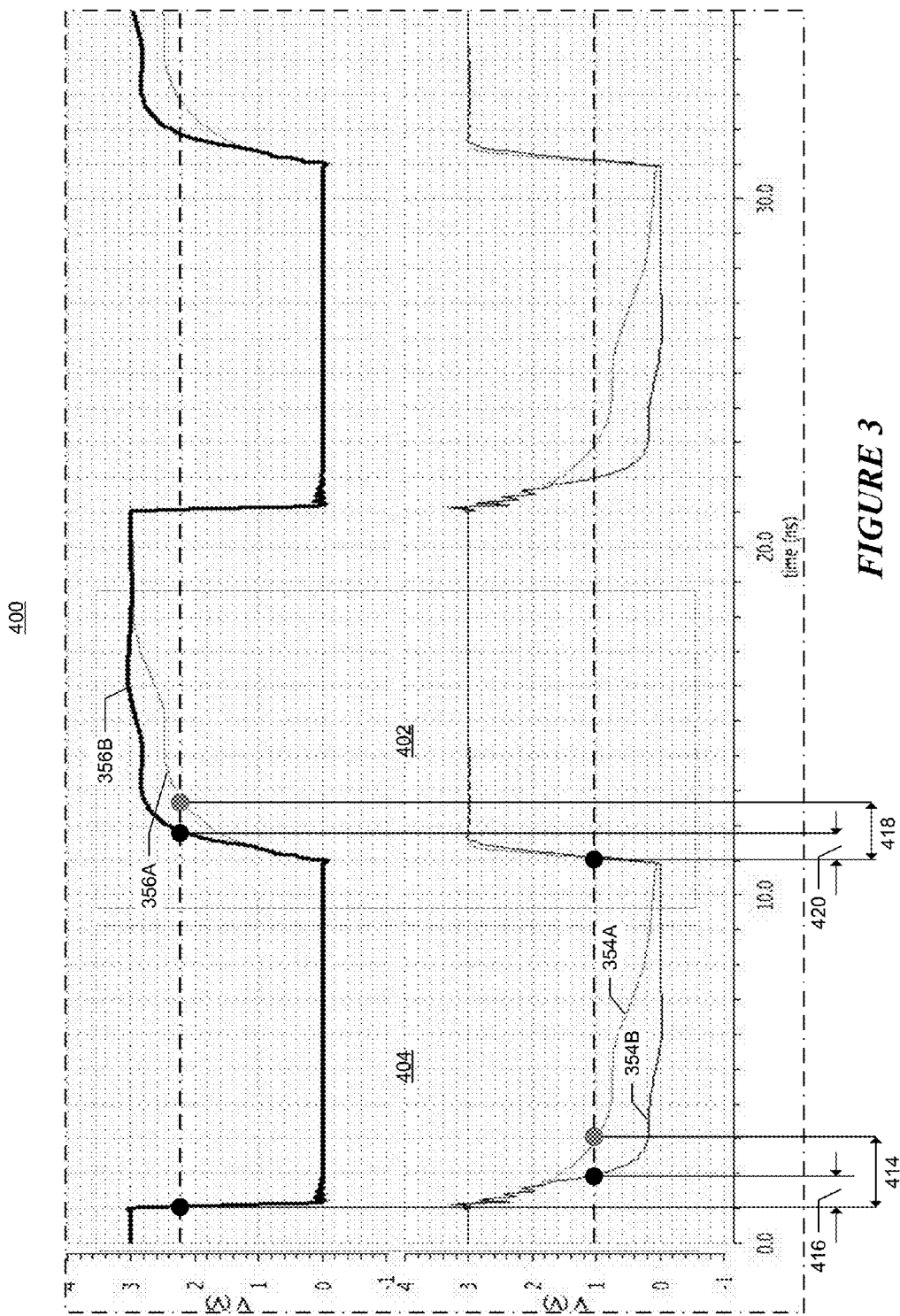
FIG. 3 illustrates an example effect of an example slew rate enhancement circuit.

FIG. 3 illustrates an example effect of an example slew rate enhancement circuit 216 on a voltage signal 354 at signal node 340 and a voltage signal 356 at signal node 342 of an output buffer 200. As shown in the example of FIG. 3, during time period 404, without slew rate enhancement circuit 216, when a voltage signal 346 at input 344 switches from logic low to logic high, voltage signal 356A at signal node 342 falls faster than voltage signal 354A at signal node 340. As a result, pull-down device 336 of output driver 218 is turned off before pull-up device 334 of output driver 218 is turned on. In contrast, during time period 402, with slew rate enhancement circuit 216, positive feedback provided by positive feedback circuit 302 of slew rate enhancement circuit 216 increases the rate of fall time (or slew rate) of the voltage signal at signal node 340, shown as voltage signal 354B. Without the slew rate enhancement circuit 216, the voltage signal 354A has a fall time $t_{FALL\_ORIGINAL}$ 414. With the slew rate enhancement circuit 216, voltage signal 354B has a reduced fall time of $t_{FALL\_NEW}$ 416 and switches from logic high to logic low faster. This causes pull-up device 334 to be turned on earlier, resulting in a substantial increase in the slew rate and a substantial decrease in the propagation delay of a rising voltage signal 360 at output 338 of output buffer 200 as illustrated in FIG. 4, discussed below.

FIG. 3 also shows that, without slew rate enhancement circuit 216, when voltage signal 346 at input 344 of the prior art embodiment of output buffer 200 switches from logic high to logic low, voltage signal 354A at signal node 340 rises faster than the voltage signal 356A at signal node 342. As a result, pull-up device 334 of output driver 218 is turned off before pull-down device 336 of output driver 218 is turned on. In contrast, in embodiments with slew rate enhancement circuit 216, positive feedback provided by positive feedback circuit 304 of slew rate enhancement circuit 216 increases a rate of rise time (or slew rate) of the voltage signal 356A at signal node 342, shown as 356B. Without slew rate enhancement circuit 216, the voltage signal 356A has a rise time $t_{RISE\_ORIGINAL}$ 418. With the slew rate enhancement circuit 216, voltage signal 356B has a reduced rise time of $t_{RISE\_NEW}$ 420 and switches from logic low to logic high faster. This causes pull-down device 336 to be turned on earlier, resulting in a substantial increase in the slew rate and a substantial decrease in the propagation delay of a falling voltage signal 360 at output 338 of output buffer 200.

Although this disclosure describes and graph 400 illustrates an example slew rate enhancement circuit 216 affecting a voltage signal 354 at signal node 340 and a voltage signal 356 at signal node 342 of an output buffer 200 in a particular manner, this disclosure contemplates any effect of the example slew rate enhancement circuit 216 on any suitable voltage signal at signal node and any suitable voltage signal at signal node of output buffer 200 in any suitable manner. Although this disclosure describes and illustrates particular elements of FIG. 3 as placed in a particular order, this disclosure contemplates any suitable elements of FIG. 3 as placed in any suitable order.

Figure 4:
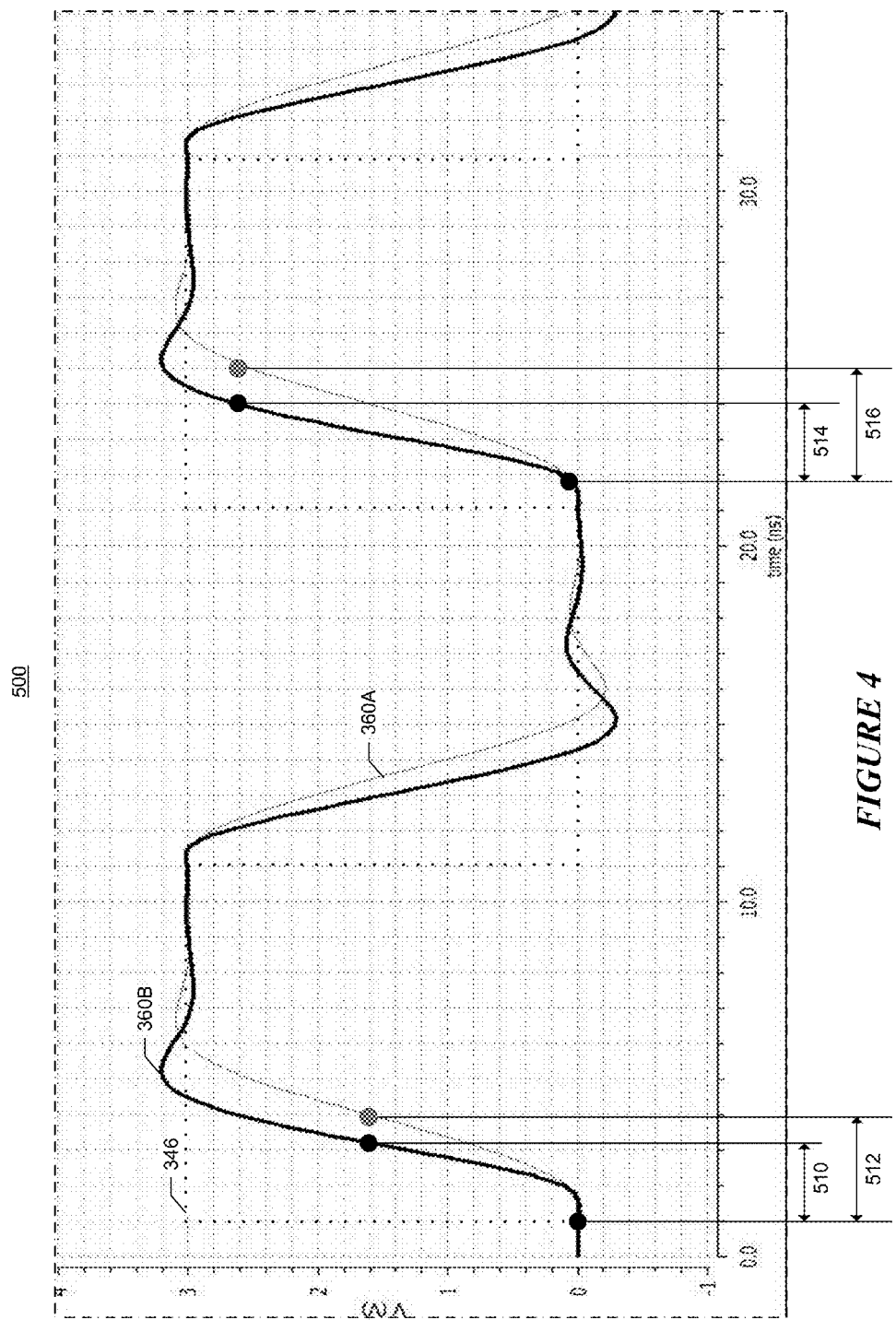
FIG. 4 illustrates an example effect of an example slew rate enhancement circuit on a voltage signal at an output of an output buffer.

FIG. 4 illustrates an example effect of an example slew rate enhancement circuit 216 on a voltage signal 360 at an output 338 of an output buffer 200. Graph 500 compares the effect of the slew rate enhancement circuit 216 on a slew rate and a propagation delay of the voltage signal 360 given a voltage signal 346 at input 344. In the example of FIG. 4, without the slew rate enhancement circuit 216, output buffer 200 generates an output signal shown as voltage signal 360A. In contrast, in the example of FIG. 4, with the slew rate enhancement circuit 216, output buffer 200 generates an output signal shown as voltage signal 360B. As illustrated in FIG. 4, using the rising edges of the voltage signals as an example and not by way of limitation, voltage signal 360A has a propagation delay (PD) $t_{PD\_ORIGINAL}$ 512. With the slew rate enhancement circuit 216, voltage signal 360B has a reduced propagation delay $t_{PD\_NEW}$ 510.

As another example and not by way of limitation, voltage signal 360A associated with the prior art embodiment has a rise time of $t_{RISE\_ORIGINAL}$ 516. With the slew rate enhancement circuit 216, voltage signal 360B has a substantially reduced rise time of $t_{RISE\_NEW}$ 514, and therefore a substantially increased slew rate and reduced propagation delay for the rising edge of voltage signal 360.

Although this disclosure describes and the graph 500 illustrates a slew rate enhancement circuit 216 affecting a voltage signal 360 at an output 338 of an output buffer 200 in a particular manner, this disclosure contemplates the slew rate enhancement circuit 216 affecting any voltage signal at any output of any output buffer in any suitable manner. Although this disclosure describes and illustrates particular elements of FIG. 4 as placed in a particular order, this disclosure contemplates any suitable elements of FIG. 4 as placed in any suitable order.

Although this disclosure describes an output buffer 200 for transforming a voltage signal 210 at input 230 between two voltage domains and driving a voltage signal 360 at output 338 across output capacitive and inductive loads, this disclosure contemplates various alternative arrangements. For example, in some embodiments, the output buffer does not include a level shifting function. In such embodiments, the pre-driver 214 may be powered by the same voltage domain or same voltage level as the driver of input 344. Particular embodiments may repeat one or more elements of FIG. 1, where appropriate. Although this disclosure describes and illustrates particular elements of an output buffer 200 of FIG. 1 as placed in a particular order, this disclosure contemplates any suitable elements of the output buffer 200 of FIG. 1 as placed in any suitable order. Furthermore, although this disclosure describes and illustrates particular components, devices, or configurations of a particular output buffer 200 of FIG. 1, this disclosure contemplates any suitable combination of any suitable components, devices, or configurations of any suitable output buffer. In some embodiments, the embodiments discussed herein are included in a cell library. The cell library may also include one or more of analog and digital input buffers, other output buffers, input/output buffers, and digital logic cells.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

The invention claimed is:

1. A circuit, comprising:
    an output driver comprising:
    a pull-up device; and
    a pull-down device;
    a pre-driver, configured to generate a first signal for the pull-up device and to generate a second signal for the pull-down device;
    a first feedback circuit configured to increase the slew rate of the first signal in response to a transition in the second signal; and
    a second feedback circuit configured to increase the slew rate of the second signal in response to a transition in the first signal, wherein each the first and second feedback circuits comprises a first inverting stage and a second inverting stage, wherein:
    the first feedback circuit is configured to conduct current from the pull-up device in response to the transition in the second signal, and the second feedback circuit is configured to conduct current to the pull-down device in response to the transition in the first signal.

2. The circuit of claim 1, wherein the first inverting stage of the first feedback circuit comprises:
a pull-up device configured to receive the first signal; and
a pull-down device configured to receive the second signal.

3. The circuit of claim 2, wherein:
the pull-down device of the output driver is configured to turn off in response to the transition in the second signal,
the pull-down device of the first feedback circuit is configured to turn off in response to the transition in the second signal, and
the pull-down device of the output driver and the pull-down device of the first feedback circuit are configured to turn off substantially simultaneously.

4. The circuit of claim 1, wherein the first inverting stage of the second feedback circuit comprises:
a pull-up device configured to receive the first signal; and
a pull-down device configured to receive the second signal.

5. The circuit of claim 4, wherein:
the pull-up device of the output driver is configured to turn off in response to the transition in the first signal,
the pull-up device of the second feedback circuit is configured to turn off in response to the transition in the first signal, and
the pull-up device of the output driver and the pull-up device of the second feedback circuit are configured to turn off substantially simultaneously.

6. The circuit of claim 1, wherein the second inverting stage of the first feedback circuit comprises:
a pull-down device configured to conditionally conduct current from the pull-up device of the output driver.

7. The circuit of claim 1, wherein the second inverting stage of the second feedback circuit comprises:
a pull-up device configured to conditionally conduct current to the pull-down device of the output driver.

8. The circuit of claim 1, wherein the circuit comprises a transistor having a gate with a length of less than 20 nm.

9. A method of manufacturing a circuit, the method comprising:
forming an output driver by forming a pull-up device and a pull-down device;
forming a pre-driver, configured to generate a first signal for the pull-up device and to generate a second signal for the pull-down device;

forming a first feedback circuit configured to increase the slew rate of the first signal in response to a transition in the second signal; and
forming a second feedback circuit configured to increase the slew rate of the second signal in response to a transition in the first signal, wherein each the first and second feedback circuits comprises a first inverting stage and a second inverting stage, wherein:
the first feedback circuit is configured to conduct current from the pull-up device in response to the transition in the second signal, and
the second feedback circuit is configured to conduct current to the pull-down device in response to the transition in the first signal.

10. The method of claim 9, wherein:
the pull-down device of the output driver is configured to turn off in response to the transition in the second signal,
the pull-down device of the first feedback circuit is configured to turn off in response to the transition in the second signal, and
the pull-down device of the output driver and the pull-down device of the first feedback circuit are configured to turn off substantially simultaneously.

11. The method of claim 9, wherein the first inverting stage of the second feedback circuit comprises:
a pull-up device configured to receive the first signal; and
a pull-down device configured to receive the second signal.

12. The method of claim 11, wherein:
the pull-up device of the output driver is configured to turn off in response to the transition in the first signal,
the pull-up device of the second feedback circuit is configured to turn off in response to the transition in the first signal, and
the pull-up device of the output driver and the pull-up device of the second feedback circuit are configured to turn off substantially simultaneously.

13. The method of claim 9 wherein the second inverting stage of the first feedback circuit comprises:
a pull-down device configured to conditionally conduct current from the pull-up device of the output driver.

14. The method of claim 9 wherein the second inverting stage of the second feedback circuit comprises:
a pull-up device configured to conditionally conduct current to the pull-down device of the output driver.

* * * * *